US011002758B2

(12) United States Patent
Brueck et al.

(10) Patent No.: US 11,002,758 B2
(45) Date of Patent: May 11, 2021

(54) RUGGED, SINGLE CRYSTAL WIDE-BAND-GAP-MATERIAL SCANNING-TUNNELING-MICROSCOPY/LITHOGRAPHY TIPS

(71) Applicant: UNM RAINFOREST INNOVATIONS, Albuquerque, NM (US)

(72) Inventors: Steven R. J. Brueck, Albuquerque, NM (US); Daniel Feezell, Albuquerque, NM (US); John Randall, Albuquerque, NM (US); Tito Busani, Albuquerque, NM (US); Joshua B. Ballard, Albuquerque, NM (US); Mahmoud Behzadirad, Albuquerque, NM (US); Ashwin Krishnan Rishinaramangalam, Albuquerque, NM (US)

( * ) Notice: Subject to any disclaimer, the term of this patent is extended or adjusted under 35 U.S.C. 154(b) by 37 days.

(21) Appl. No.: 16/095,011

(22) PCT Filed: Apr. 24, 2017

(86) PCT No.: PCT/US2017/029180
§ 371 (c)(1),
(2) Date: Oct. 19, 2018

(87) PCT Pub. No.: WO2018/022154
PCT Pub. Date: Feb. 1, 2018

(65) Prior Publication Data
US 2019/0120873 A1    Apr. 25, 2019

Related U.S. Application Data

(60) Provisional application No. 62/327,294, filed on Apr. 25, 2016.

(51) Int. Cl.
*G01Q 70/10*    (2010.01)
*G01Q 70/12*    (2010.01)
(Continued)

(52) U.S. Cl.
CPC .......... *G01Q 60/16* (2013.01); *B82B 3/0004* (2013.01); *G01Q 70/06* (2013.01); *G01Q 70/10* (2013.01); *G01Q 70/14* (2013.01); *G01Q 80/00* (2013.01); *G03F 7/0002* (2013.01); *G01Q 70/12* (2013.01)

(58) Field of Classification Search
None
See application file for complete search history.

(56) References Cited

U.S. PATENT DOCUMENTS

| | | | |
|---|---|---|---|
| 4,943,720 A | 7/1990 | Jones | |
| 2004/0075464 A1* | 4/2004 | Samuelson | H01L 29/20 326/37 |

(Continued)

FOREIGN PATENT DOCUMENTS

| | | | |
|---|---|---|---|
| JP | 2008026281 A | * | 2/2008 |
| JP | 2008026281 A | | 2/2008 |

OTHER PUBLICATIONS

Bogdanowicz et al., Fabrication and characterization of boron-doped nanocrystalline diamond-coated MEMS probes, Appl. Phys. A 122 (2016) (Year: 2016).*

(Continued)

*Primary Examiner* — James Choi
(74) *Attorney, Agent, or Firm* — MH2 Technology Law Group LLP

(57) ABSTRACT

Provided is a composite metal-wide-bandgap semiconductor tip for scanning tunneling microscopy and/or scanning, tunneling lithography, a method of forming, and a method for using the composite metal-wide-bandgap semiconductor tip.

15 Claims, 4 Drawing Sheets

(51) Int. Cl.
  *G01Q 60/16*   (2010.01)
  *B82B 3/00*    (2006.01)
  *G01Q 70/06*   (2010.01)
  *G01Q 70/14*   (2010.01)
  *G01Q 80/00*   (2010.01)
  *G03F 7/00*    (2006.01)

(56) References Cited

U.S. PATENT DOCUMENTS

| | | | |
|---|---|---|---|
| 2005/0017171 A1* | 1/2005 | Samuelson | B82Y 15/00 250/306 |
| 2008/0011058 A1* | 1/2008 | Lal | G01N 29/022 73/54.23 |
| 2010/0005553 A1* | 1/2010 | Jin | G01Q 60/38 850/58 |
| 2010/0017922 A1 | 1/2010 | Shen et al. | |

OTHER PUBLICATIONS

Flöhr et al. Scanning tunneling microscopy with InAs nanowire tips, Appl. Phys. Lett. 101, 243101 (2012) (Year: 2012).*

Sladek et al. Comparison of InAs nanowireconductivity: influence ofgrowth method and structure, Phys. Status Solidi C 9, No. 2, 230-234 (2012) (Year: 2012).*

PCT International Search Report and Written Opinion dated Feb. 21, 2018 in International Application No. PCT/US2017/029180, 6 pages.

* cited by examiner

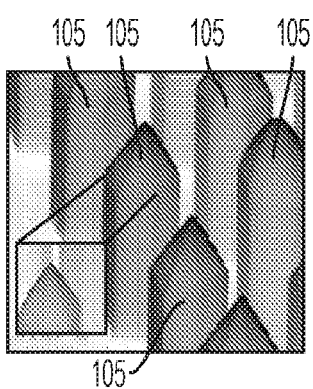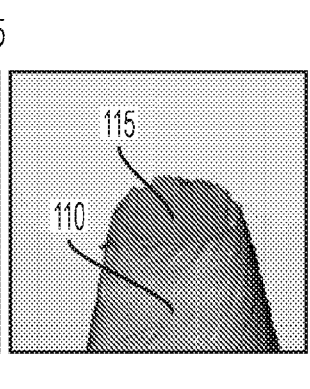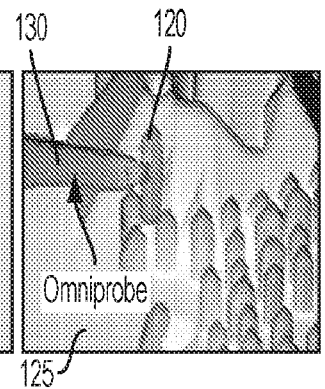
FIG. 1A  FIG. 1B  FIG. 1C
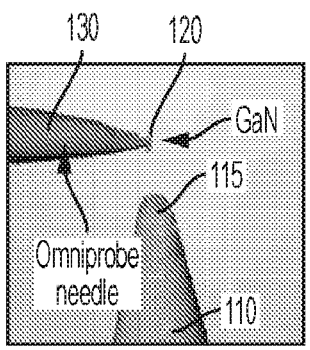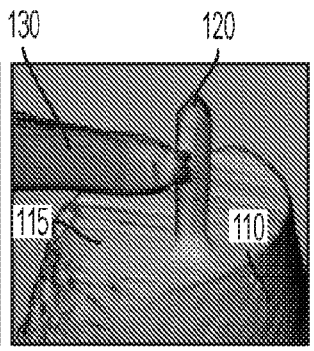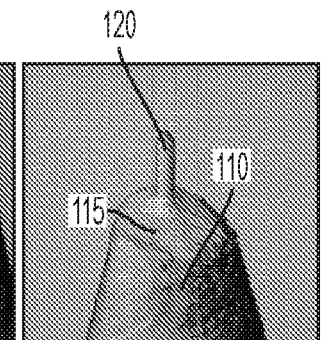
FIG. 1D  FIG. 1E  FIG. 1F Spin coating photoresist on $Si_3N_4/Si(111)$ Patterning $Si_3N_4$ on Si(111)

Dry etching Si and removing $Si_3N_4$ and formation of Si pedestals

Thermally oxidation of Si and defining open windows on pillars through lithography Selective area growing of sharp GaN NWs on Si Remove of grown GaN STM tips pedestals by etching or by Dicing

RUGGED, SINGLE CRYSTAL WIDE-BAND-GAP-MATERIAL SCANNING-TUNNELING-MICROSCOPY/ LITHOGRAPHY TIPS

CROSS-REFERENCE TO RELATED APPLICATIONS

This application is a U.S. National Phase application of PCT/US2017/029180 filed Apr. 24, 2017, which claims the benefit of U.S. provisional patent application No. 62/237,294, filed on Apr. 25, 2016, the entireties of which are incorporated herein by reference.

GOVERNMENT FUNDING

Support for this work was provided by National Science Foundation under subcontracts from RPI (LESA ERC) (grant no. EEC-0812056), from UT-Austin (NASCENT ERC) (grant no. EEC-1160494), and from a DARPA contract administered by AFRL (contract no. FA-8650-15-C-7542). The Government has certain rights in the invention.

BACKGROUND

A scanning tunneling microscope (STM) is an instrument that provides images of solid surfaces with atomic resolution. The operation of the STM is based on the tunneling current, which flows when a very sharp tip biased relative to a conducting substrate approaches the conducting surface at a distance of approximately one nanometer. The tip is mounted on a piezoelectric tube, which moves the tip vertically (perpendicularly to the sample surface) and horizontally (parallel to the sample surface) by applying voltages to its electrodes. Thereby, the electronics of the STM system control the tip position in such a way that the tunneling current or the distance between the tip and the surface is kept constant, while at the same time scanning a small area of the sample surface. This movement is recorded by the computer, which can generate an image of the surface topography. Under ideal circumstances, the individual atoms of a surface can be resolved and displayed.

In a similar way STM is used for surface modification of a metallic or semiconductor surface allowing controlled nano-patterning of those surfaces. One of the first demonstrations was made by T. C. Shen et al. (Shen, T. C., Wang, C., Abeln, G. C., Tucker, J. R., Lyding, J. W., Avouris, Ph., Walkup, R. E. Atomic-Scale desorption through electronic and vibrational excitation mechanisms. *Science* 268, 1590-1592 (1995)) using an STM to control surface reactions with adsorbed atoms and molecules. Shen et al. demonstrated that it was possible to use an STM tip to desorb hydrogen from hydrogen terminated silicon (100) substrates, using a multiple vibrational excitation technique with tunneling electrons at low applied voltages, and proposed that single H atom desorption was possible. However their results showed that in general the high current densities employed often meant that both H atoms on a single silicon dimer were desorbed. Today when we discuss surface modification using STM tips, we refer to applications including but not limited to: reconstruction of annealed surface of semiconductors and metals; modification through surface chemistry and annealed surfaces of semiconductors and metals; lithography; creation of memory sites for storage and digital information and quantum computing.

The recent technical developments in STM, however, have shown that this technology does not allow large areas of patterning with a high yield. The problem is that the tip usually is modified by the large field applied, with atoms moving in response to the large applied fields thereby changing the atomic scale morphology and giving uncontrolled shifts and distortions to the lithographic pattern. This modifies the atomic details of the STM tip apex, which impacts its ability to write consistently.

Through the years several methods of preparing STM tips have been developed. Many different materials have been used. Some of the most common materials used today are tungsten (W), platinum iridium (PtIr) and gold (Au). Tips made with those materials can be prepared by various methods. Typically electrochemical etching or wet etchings are employed. These are all crystalline, polycrystalline, or amorphous metals with relative high atomic mobilities along the surface that show significant changes to the tip under continued writing conditions, limiting the amount of writing before reconditioning of the tip is required.

Thus, a heretofore unaddressed need exists in the industry to address the aforementioned deficiencies and inadequacies.

SUMMARY

According to examples of the present disclosure, a composite tip for scanning tunneling microscope ("STM") is provided. The composite tip comprises an electrically conductive wire; and a tip affixed to the electrically conductive wire, wherein the tip comprises a single crystal wide-band-gap semiconductor. In some examples, a first surface at a first longitudinal end of the tip is affixed to a second surface at a longitudinal end of the electrically conductive wire. In some examples, the composite tip has dimensions of from 0.5 to 4 µm long and about 0.1 to 1 µm faceted diameter and a resistivity of about $10^{-2}$ Ohm-cm coming to a sharp point at the end of the tip with a radius of about or less than 2 nm. In some examples, the electrically conductive wire comprises platinum, iridium, tungsten, and doped silicon and/or combinations thereof. In some examples, the single crystal wide-band-gap semiconductor comprises a group III-N nanowire wherein the group III composition comprises one or more of Ga, In, or Al. In some examples, the group III-N nanowire is grown by selective area epitaxy and the growth process is controlled to produce the sharp tip with a radius of about or less than 2 nm. In some examples, the electrically conductive wire and the tip are affixed having a common orientation within about ±1°.

According to examples of the present disclosure, a method of forming a composite tip for a scanning tunneling microscope ("STM") is provided. The method comprises using a nanomanipulator to select a single crystal wide-band-gap semiconductor from an array of formed single crystal wide-band-gap semiconductors epitaxially grown selectively on a crystalline substrate; preparing an electrically conductive wire to provide a substantially flat end surface that is substantially perpendicular to the wire length direction; transferring the single crystal wide-band-gap semiconductor from the growth substrate to the substantially flat end surface of the electrically conductive wire; and affixing the single crystal wide-band-gap semiconductor to the substantially flat end surface of the electrically conductive wire to form the composite tip. In some examples, the affixing comprises welding using a Pt ion source. In some examples, the single crystal wide-band-gap semiconductor comprises a group III-N nanowire wherein the group III composition comprises one or more of Ga, In, or Al. In some examples, the composite tip has dimensions that are from about a length of 0.5 to 4 µm, with a faceted diameter of about 0.1 to 1 µm, a tip radius of about or less than about 2 nm, and with a controlled doping to provide a resistivity of about $10^{-2}$ Ohm-cm. In some examples, the electrically conductive wire comprises platinum, iridium, tungsten, and doped silicon and combinations thereof. In some examples, the electrically conductive wire and the tip is affixed having a common orientation within about ±1°.

According to examples of the present disclosure, a method of forming an array of composite tips for use in scanning tunneling microscopy is provided. The method comprises preparing an array of scanning tunneling microscope tip precursors on a crystalline substrate; providing an area for selective area growth of a wide bandgap semiconducting material on each tip precursor, growing a III-N wide bandgap material nanowire on each selective growth area wherein the nanowire has a faceted diameter of about 0.1 to 0.5 µm, a tip radius of about or less than about 2 nm, and with a controlled doping to provide a resistivity of about $10^{-2}$ Ohm-cm; separating the array of scanning tunneling tip precursors into subarrays wherein each subarray contains at least one scanning tunneling tip; and mounting the at least one of the subarrays of scanning tunneling microscope tip precursors for use in a scanning tunneling microscope. In some examples, the wide bandgap material is one of GaN, AlN, InN, or alloys thereof. In some examples, the growth technique is metal organic chemical vapor deposition and the growth is controlled to provide the sharp tip of the nanowire with a radius of less than about 2 nm without further processing. In some examples, a sub-array contains only a single scanning tunneling tip precursor. In some examples, a sub-array contains more than one scanning tunneling tip precursor and means is provided for relative motion between the multiple scanning tunneling tips to allow for a degree of parallel application in a scanning tunneling microscope.

According to examples of the present disclosure, a composite metal-wide-band-gap semiconductor ("WBS") tip for scanning tunneling microscopy ("STM") and/or scanning tunneling lithography ("STL") is provided that comprises a single crystal WBS tip affixed to a metal wire for use in the STM/STL. In some examples, the composite metal-GaN tip has dimensions of from 0.5 to 4 µm long and a faceted diameter of 0.1 to 1 µm coming to a sharp tip with a tip radius of about or less than 2 nm and a resistivity of about $10^{-2}$ Ohm-cm. The resistivity is controlled by doping during growth and can have a wide range. For the STM/STL application, the composite metal-GaN tip has an electrical conductivity to allow a tunneling current flow between the tip and the sample. In some examples, the composite metal-WBS tip is used under ultrahigh vacuum conditions.

According to examples of the present disclosure, a method of forming a composite metal-WBS tip for a STM and/or STL is provided. The method comprises growing an array of WBS tips by selective-area metal-organic chemical vapor deposition on a growth substrate; selecting a single WBS nanowire from the array with a nanomanipulator; transferring the single WBS nanowire from the growth substrate to a wire prepared with a substantially flat surface perpendicular to the wire direction; and welding the single WBS nanowire to the flat surface of the STM wire using an Pt ion source. In some examples, the dimensions of the WBS nanowire are from about a length of 0.5 to 4 µm, with a faceted diameter of about 0.1 to 1.0 µm, coming to a sharp tip radius of about or less than about 2 nm, and with a controlled doping to provide a resistivity of about $10^{-2}$ Ohm-cm. In some examples, the composite metal-WBS tip is used under ultrahigh vacuum conditions. In some examples, the WBS is an AlGaInN alloy.

According to examples of the present disclosure, a method of forming multiple composite silicon-WBS tips for a STM and/or STL is provided. The method comprises preparing an array of Si STM tips with 3D silicon manufacturing techniques; protecting all but selective growth areas of the Si STM tips with a dielectric film; using selective area metal organic chemical vapor deposition ("MOCVD") to grow WBS nanowires from the selective areas; separating individual silicon-WBS structures for use in STM and/or scanning tunneling lithography. In some examples, the dimensions of the GaN nanowires are from 0.5 µm to about 4 µm long with a faceted diameter of from about 0.1 to about 1.0 µm (0.1-1 µm) with a tip radius of about 2 nm and doped to provide a resistivity of about $10^{-2}$ Ohm-cm. In some examples, the composite metal-GaN tip is used under ultrahigh vacuum conditions.

According to examples of the present disclosure, a method of forming of an array of independently addressed tips for parallel applications of STM and/or STL is provided. The method comprises forming a 3D silicon structure with a linear array of independently addressable structures that are individually bent out of the plane of the Si with applied fields; protecting all but selective growth areas of the Si structures with a dielectric film; using selective area metal organic chemical vapor deposition ("MOCVD") to grow WBS nanowires from the selective areas; providing individually addressable electrical contacts to each element of the array; and mounting the array in a STM or scanning tunneling lithography apparatus. In some examples, the dimensions of the WBS nanowires are from about 0.5 to about 4 µm long with a faceted diameter of from about 0.1-1 µm with a tip radius of about 2 nm and doped to provide a resistivity of about $10^{-2}$ Ohm-cm.

According to examples of the present disclosure, a method of using an array of composite metal-WBS tips for STM and/or STL is provided. The method comprises individually addressing each composite metal-WBS tip to provide a lithographic capability; scanning the array in one or more surface directions of a substrate; moving one or more individual tips in an orthogonal direction to the one or more surface directions to maintain constant each individual tunneling current and writing individual pixels.

According to examples of the present disclosure, a composite metal-WBS tip for scanning tunneling microscopy and/or scanning tunneling lithography is provided according to examples of the present disclosure. According to examples of the present disclosure, a method of forming one or more composite metal-GaN tips for scanning tunneling microscopy and/or scanning tunneling lithography is provided. According to examples of the present disclosure, a method for using one or more metal-GaN tips for STM and/or STL is provided.

BRIEF DESCRIPTION OF THE DRAWINGS

The accompanying drawings, which are incorporated in and constitute a part of this specification, illustrate embodiments of the present teachings and together with the description, serve to explain the principles of the disclosure.

FIG. 1A shows a SEM image of GaN nanowires grown on $Al_2O_3$ substrate by MOCVD (metal-oxide chemical vapor deposition), where the inset shows zoom in on the top of the nanowire, according to examples of the present disclosure.

FIG. 1B shows a metallic wire after milling a more or less flat surface with an FIB (focused ion beam tool), according to examples of the present disclosure.

FIG. 1C shows detaching from substrate by welding the NW to an omniprobe needle, according to examples of the present disclosure.

FIG. 1D shows transferring and positioning NW on the metallic wire surface, according to examples of the present disclosure.

FIG. 1E shows seating NW perpendicular to the surface and welding by Pt deposition, according to examples of the present disclosure.

FIG. 1F shows welding all around to stabilize STM tip, according to examples of the present disclosure.

DESCRIPTION OF THE EMBODIMENTS

Figure 2:
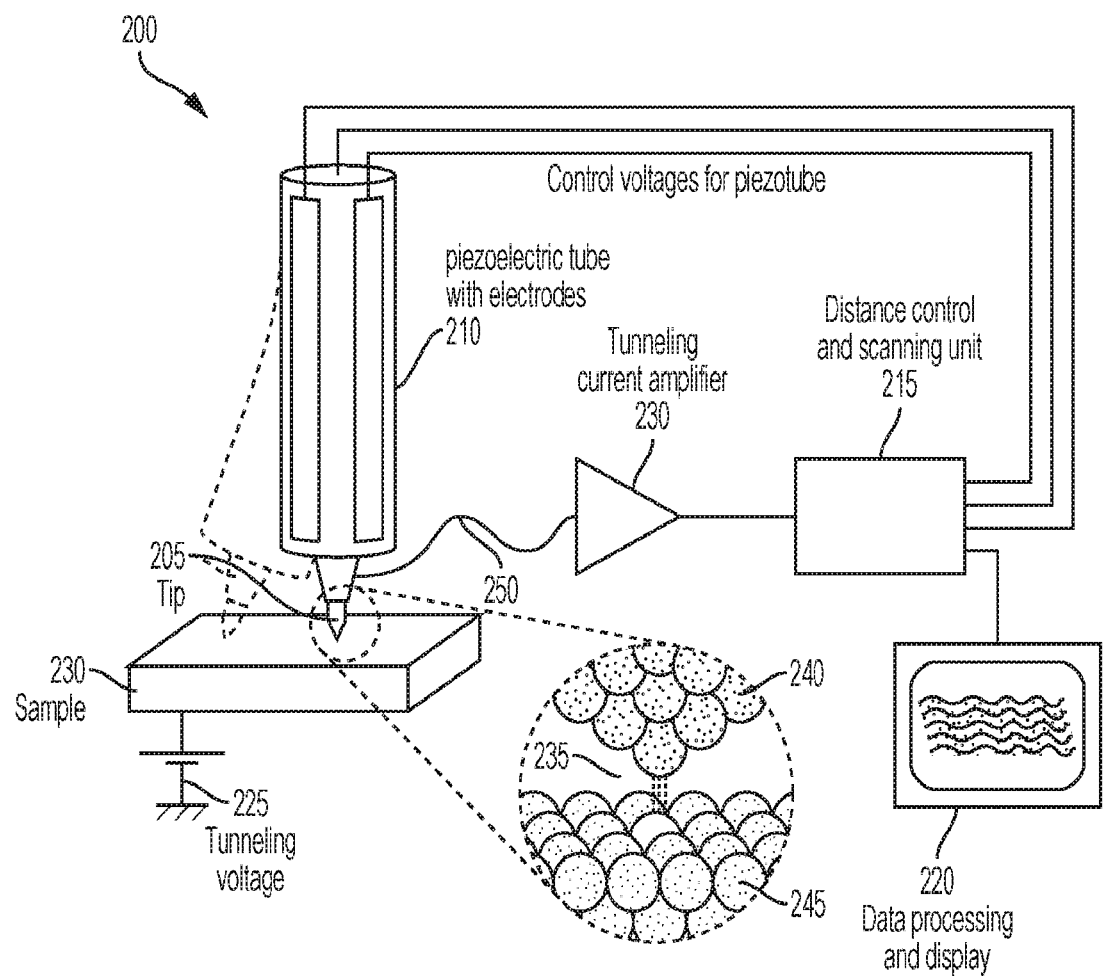
FIG. 2 shows a STM with a GaN tip, according to examples of the present disclosure.

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

The following embodiments are described for illustrative purposes only with reference to the Figures. Those of skill in the art will appreciate that the following description is exemplary in nature, and that various modifications to the parameters set forth herein could be made without departing from the scope of the present embodiments. It is intended that the specification and examples be considered as examples only. The various embodiments are not necessarily mutually exclusive, as some embodiments can be combined with one or more other embodiments to form new embodiments.

Generally speaking, examples of the present disclosure provides a composite tip for a scanning tunneling microscope ("STM"), methods of making the composite tip, and various uses for the composite tip. The composite tip comprises an electrically conductive wire and a tip affixed to the electrically conductive wire, wherein the tip comprises a single crystal wide-band-gap semiconductor. The single crystal wide-band-gap semiconductor can comprise a group III-N nanowire, wherein the group III-N nanowire can comprise GaN, AlN, InN, InGaN, AlGaN, or AlInGaN. Other materials as disclosed herein can also be used for the single crystal wide-band-gap semiconductor. The wide-bandgap semiconductor material can be formed into a single crystal nanowire. In one example, the single crystal nanowire tip is grown epitaxially with a controlled dopant distribution to provide a controlled resistivity, and with a faceted crystal shape that provides a tip with a radius of less than about 2 nm without requiring tip sharpening as do the metal tips. The electrically conductive wire can be composed of materials, including but are not limited to: platinum; iridium; tungsten; doped semiconductors; and combinations thereof.

As used herein, the term "nanowire" generally refers to any elongated conductive or semiconductive material that includes at least one minor dimension, for example, one of the cross-sectional dimensions such as width or diameter, of less than or equal to about 1000 nm. In various embodiments, the minor dimension can be less than about 100 nm. In various other embodiments, the minor dimension can be less than about 10 nm. In various examples, the diameter can be about 0.1 to 1 μm. The nanowires can have an aspect ratio (e.g., length:width and/or major dimension:minor dimension) of about 100 or greater. In various embodiments, the aspect ratio can be about 200 or greater. In various other embodiments, the aspect ratio can be about 2000 or greater. In an exemplary embodiment, the cross-section of the nanowire can be highly asymmetric such that in one direction of the cross-sectional dimension can be much less than 1000 nm and in an orthogonal direction the dimension can be substantially greater than 1000 nm.

It is also intended that the term "nanowires" also encompass other elongated structures of like dimensions including, but not limited to, nanoshafts, nanopillars, nanoneedles, nanorods, and nanotubes (e.g., single wall nanotubes, or multiwall nanotubes).

The nanowires can have various cross-sectional shapes, such as, for example, rectangular, hexagonal, polygonal, square, oval, or circular. Accordingly, the nanowires can have cylindrical and/or cone-like three dimensional (3-D)

shapes. In various embodiments, a plurality of nanowires can be, for example, substantially parallel with respect to each other.

Metallic bonds largely ionic and bond angles are not strongly sterically limited, allowing W atoms to move on the surface, while the covalent bonds of WBS materials provide a more significant steric hindrance to motion of individual atoms along a surface. Covalent bonds and their sensitivity to bond angle results in a lower surface mobility than for ionic metal bonds. This is the primary advantage to the use of covalently bonded materials for STM and/or STL applications as opposed to the use of metallic materials with comparable bond strengths. For example, surface Si atoms (at least ones that are dimerized or are part of an island) are stable at room temperature, while W atoms will move from island edges to lower surface energy facets at room temperature, supporting the proposition that GaN will be more stable than W as an STM tip. As such, STM tips made of GaN or related wide band gap semiconductors tend to be more robust than W tips. Also, GaN can be grown with a sharp tip not requiring any additional processing. In contrast, an initially single crystal tungsten material must be machined/milled/etched/etc. into a tip shape leaving complex faceting and adatoms that are probably not incorporated into the lattice.

An additional advantage of the current invention is that the tip shape is actually known. Not only at the apex but over the entire physical range of the tip that contributes to the imaging and lithography modes of operation. For imaging this range is very small (on the order of a nm distance from the apex), but for lithography in the high bias mode where the tip is effectively a cold field emitter of electrons, the portion of the tip that controls the emission is on the order of a micrometer from the tip apex. The WBS tips have a well-defined shape that will give far more reproducible lithographic results in the high-bias mode. In contrast the tip shape for metal tips is almost never known.

According to examples, the composite tip is constructed to have one or more of the following attributes in order to overcome the issues of the conventional tips, as described above. First, the composite tip can be conductive in order to support the tunneling current Second, the composite tip can have a sharp apex, possibly ending with a well-defined atomic arrangement determined by the local atomic structure and bonding. Within the context of this disclosure, the term "sharp" will mean a tip with a radius of less than about 2 nm, for example, a radius between about 1 nm and about 2 nm. Third, the composite tip can have atomic bonds stronger than the atomic bonds that need to be broken on the surface of the sample where the pattern is to be created. Fourth, the composite tip can be manufactured in a very clean environment, as is known in the art.

Compared to crystalline, polycrystalline, or amorphous metals, single crystal nitrides tend to have exceptionally strong bonds and they can be readily grown in a single crystal with a sharp termination defined by natural crystal planes. The process also allows control, at the nm scale, of the x,y,z dimensions of the tip, as well the doping of the tip (i.e. its resistivity) in order to regulate the current flow between the STM tip and the sample.

In order to meet these requirements, example composite tips were made and tested by the inventors that were fabricated using single crystalline nanowire GaN bonded to PtIr wire holders. Although the direct growth of single crystalline GaN nanowire tips on substrates suitable for use in a STM apparatus is discussed further below, a composite tip comprising Group III-N nanowires bonded to metallic wires can be used as discussed herein. FIGS. 1A-1F show a series of images depicting a method for the fabrication of the GaN STM tips, according to examples of the present disclosure. FIG. 1A shows an array of GaN tips 105 are grown by selective-area Metal Organic Chemical Vapor Deposition (MOCVD) on a sapphire ($Al_2O_3$) substrate, in form of a sharp tip (a radius about ≤2 nm, for example, a radius between about 1 nm and about 2 nm, measurement limited by SEM resolution) NWs. Alternatively to sapphire, the substrate can also comprise material including, but not limited to, silicon (111) and silicon carbide. The GaN nanowire is referred to as the STM tip from hereon. The growth was performed using pulsed growth mode followed by continuous flow growth mode to enable a sharp tip. The nanowires were doped n-type with silicon at a concentration of about $2 \times 10^{18}$ $cm^{-3}$, which results in a resistivity of about 0.025 Ω-cm. The GaN tips were designed to be 500-700 nm diameter in cross section and 2000 nm long to assure a resistance of about 2 kW.

As known in the art, nanowires can be formed using a variety of methods. For examples, the nanowires can be formed using any of the method disclosed in the following references: S. D. Hersee et al. GaN nanowire light emitting diodes based on templated and scalable growth process. *Electronic Letters*. Vol. 45. No. 1 (Jan. 1, 2009); A. K. Rishinaramangalam et al. Controlled Growth of Ordered III-Nitride Core-Shell Nanostructure Arrays for Visible Optoelectronic Devices. *Journal of Electronic Materials*. (Oct. 21, 2014) (doi: 10.1007/s11664-014-3456-z); M. Nami et al. Tailoring the morphology and luminescence of GaN/InGaN core-shell nanowires using bottom-up selective-area epitaxy. *Nanotechnology* 28 (Dec. 2, 2016) (doi: 10.1088/0957-4484/28/2/025202); and S. D. Hersee et al. The Controlled Growth of GaN Nanowires. Nano Letters. Vol. 6, No. 8, 1808-1811 (2006).

In one example as described in U.S. Pat. No. 8,410,496 titled "Pulsed Growth of Catalyst-Free Growth of GaN Nanowires and Application in Group III Nitride Semiconductor Bulk Material," issued on Apr. 2, 2013, which can be used to form the present nanowires, the nanowires can be formed on/from a support, which can include selected surface regions where the nanowires can be connected to and extend (e.g., be grown) from. The support of the nanowires can also include a substrate formed from a variety of materials including Si, SiC, sapphire, III-V semiconductor compounds such as GaN, or GaAs and related compounds. The support of the nanowires can also include a selective growth mask formed on the substrate. In various examples, the support of the nanowires can further include a buffer layer disposed between the selective growth mask and the substrate.

In various examples, the nanowires and/or nanowire arrays can be formed using a III-V compound semiconductor materials system, for example, the group III-N compound materials system Examples of the group III elements can include Ga, In, or Al, which can be formed from exemplary group III precursors, such as trimethylgallium (TMGa) or triethylgallium (TEGa), trimethylindium (TMIn) or trimethylaluminum (TMAl). Exemplary N precursors can be, for example, ammonia ($NH_3$). Other group V elements can also be used, for example, P or As, with exemplary group V precursors, such as tertiarybutylphoshine (TBP), or arsine ($AsH_3$).

In the following description, group III-N semiconductor alloy compositions can be described by the combination of group III-N elements, such as, for example, GaN, AlN, InN, InGaN, AlGaN, or AlInGaN. Generally, the elements in a composition can be combined with various molar fractions. For example, the semiconductor alloy composition InGaN can stand for $In_xGa_{1-x}N$, where the molar fraction, x, can be any number less than 1.00. In addition, depending on the molar fraction value, various active devices can be made by similar compositions.

In various embodiments, the nanowires and/or nanowire arrays can include a dopant from a group consisting of: a p-type dopant from Group II of the periodic table, for example, Mg, Zn, Cd and Hg; a p-type dopant from Group IV of the periodic table, for example, C; or an n-type dopant selected from a group consisting of: Si, Ge, Sn, S, Se and Te.

In various embodiments, the nanowires and/or nanowire arrays can have high-quality heterogeneous structures and be formed by various crystal growth techniques including, but not limited to, metal-organic chemical vapor deposition (MOCVD) (also known as organometallic vapor phase epitaxy (OMVPE)), molecular-beam epitaxy (MBE), gas source MBE (GSMBE), metal-organic MBE (MOMBE), atomic layer epitaxy (ALE), or hydride vapor phase epitaxy (HVPE).

In various embodiments, a multiple-phase growth mode, for example, a two-phase growth mode, can be used for the high-quality crystal growth of nanowires and/or nanowire arrays. For example, a first phase growth mode such as a selective growth mode can be used to provide a condition for growth selectivity and nucleation of the nanowires and/or nanowire arrays. In the selective growth mode, standard crystal growth methods, for example, standard MOCVD, can be used to nucleate the growth of the nanowires with a desired thickness of, for example, about 10 nm or more.

The second phase growth mode can create a process to continue the growth of each nanowire and maintain its cross-sectional features from the first growth mode, and also provide an arbitrary desired length. The second phase growth mode can be applied by a growth-mode-transition, which can terminate the first phase growth mode. In the second phase growth mode, a pulsed growth mode, for example, a pulsed MOCVD growth, can be used.

As used herein, the term "pulsed growth mode" refers to a process in which the group III and group V precursor gases are introduced alternately in a crystal growth reactor with a designed sequence. For example, TMGa and $NH_3$ can be used as the precursors for an exemplary formation of GaN nanowires and/or nanowire arrays. In the pulsed growth mode, TMGa and $NH_3$ can be introduced alternately in a sequence that introduces TMGa with a designed flow rate (e.g., about 10 sccm) for a certain period of time (e.g., about 20 seconds) followed by introducing $NH_3$ with a designed flow rate (e.g., about 1500 sccm) for a time period (e.g., about 30 seconds). In various embodiments, one or more sequence loops can be conducted (e.g., repeated) for a designed length of each nanowire. In various embodiments, the growth rate of each nanowire can be orientation dependent.

Additional growth phases can be used, for example, the growth can be switched from pulsed growth to continuous growth to encourage the formation of a sharp tip at the later stages of growth.

In various embodiments, dielectric materials can be involved in formation of the disclosed nanowires and/or nanowire arrays. For example, the selective growth mask can be made of dielectric materials during the formation of the plurality of nanowires and/or nanowire arrays. As used herein, the dielectric materials can include, but are not limited to, silicon dioxide ($SiO_2$), silicon nitride ($Si_3N_4$), silicon oxynitride (SiON), fluorinated silicon dioxide (SiOF), silicon oxycarbide (SiOC), hafnium oxide ($HfO_2$), hafnium-silicate (HfSiO), nitride hafnium-silicate (HfSiON), zirconium oxide ($ZrO_2$), aluminum oxide ($Al_2O_3$), barium strontium titanate (BST), lead zirconate titanate (PZT), zirconium silicate ($ZrSiO_2$), tantalum oxide ($TaO_2$) or other insulating materials. According to various other embodiments, a conducting metal growth mask, such as, for example, tungsten can be used for selective growth of the disclosed nanowires.

FIG. 1B shows an electrically conductive wire 110 that has been prepared to host the STM tip. Using a Focused Ion beam apparatus (FIB), the tip of the wire was cut off to provide a plateau 115 with a diameter of about 1 µm to host the STM tip 120. FIG. 1C shows the STM tip 120 being removed from the sapphire ($Al_2O_3$) substrate 125 using an Omniprobe needle 130 that is available on a SEM/FIB tool. Other known suitable tools can be used to remove the STM tip from the substrate. The STM tip 120 was attached to the Omniprobe needle 130 by Pt deposition and was detached from the substrate 125 by applying mechanical force. FIG. 1D shows the STM tip 120 is then transferred and positioned on the top of the wire 110. The STM tip 120 is affixed in a substantially perpendicular orientation to the plateau 115 of the wire 110. FIG. 1E shows the STM tip 120 being welded to the plateau 115 of the wire 110. When the vertical condition, including about ±1° from true vertical, was approached by moving the STM tip 120 around on the plateau 115 (which has some residual roughness at the nm-scale), the STM tip 120 was welded to the plateau 115 using Pt deposition. To weld the STM tip 120, a scanning electron microscope (SEM) was used to avoid either damage to the nanowire due to the high ion energies or Ga-implantation into the nanowire, which can modify the electrical properties of the overall structure. After welding one side of the STM tip 120, the Omniprobe needle 130 was detached from the STM tip 120 using mechanical force. FIG. 1F shows the other sides of the STM tip 120 after being welded by rotating stage on SEM to ensure the STM tip 120 is secure for operation in an STM apparatus. The combined semiconductor tip 120 affixed to the wire 110 is then termed a composite tip.

FIG. 2 shows a STM 200 using the composite tip, such as the GaN tip 205, according to examples of the present disclosure. The STM 200 includes a scanning composite tip, e.g., the GaN tip 205, a piezoelectric controlled height and x,y scanner 210, a sample-to-tip control 215, and a computer 220. The STM 200 can include additional components as known in the art. In operation, a voltage bias 225 is applied and the GaN tip 205 is brought close to a sample 230 by the sample-to-tip control 215, which is turned off when the GaN tip 205 and the sample 230 are sufficiently close. At close range, fine control of the GaN tip 205 in all three dimensions when near the sample is typically piezoelectric, maintaining tip-sample separation W typically in the 4- to 7-Å (0.4-0.7 nm) range, which is the equilibrium position between attractive (3<W<10 Å) and repulsive (W<3 Å) interactions. In this situation, the voltage bias 225 will cause electrons 235 to tunnel between the atoms 240 of the GaN tip 240 and atoms 245 of the sample 230, creating a tunneling current 250 that is amplified by a tunneling current amplifier 230 and that can be measured by the computer 220. Once tunneling is established, the bias and position of the GaN tip 205 with respect to the sample 230 can be varied and data are obtained from the resulting changes in current. With the help of the tunneling current 250, the computer 220 can provide feedback to the sample-to-tip control 215 to keep the distance between the GaN tip 205 and the sample 230 constant. If the tunneling current 250 exceeds its preset value, the distance between the GaN tip 205 and the sample 230 is decreased, if it falls below this value, the feedback increases the distance. The GaN tip 205 can be scanned line by line above the surface of the sample 230 following the topography of the sample 230.

Figure 3A:
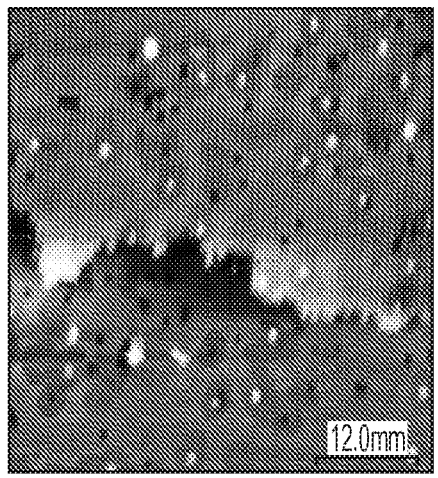
FIG. 3A is a STM image of Si(100) surface, according to examples of the present disclosure.
Figure 3B:
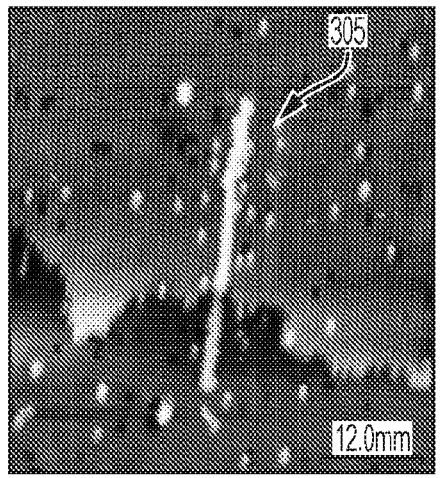
FIG. 3B is a STM image of a Si surface showing surface reconstruction, according to examples of the present disclosure. The vertical white line 305 was written by the STM by H-deprotection of the Si surface.
Figure 3C:
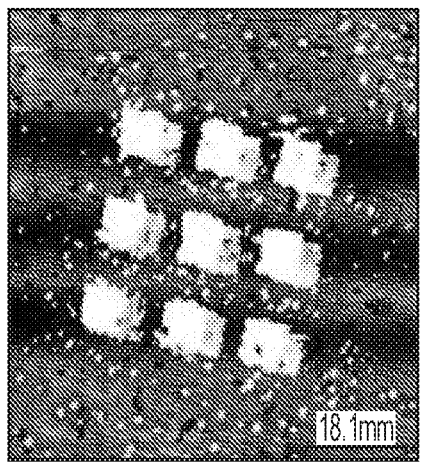
FIG. 3C is a STM image of a Si surface showing surface reconstruction of 9 boxes, according to examples of the present disclosure.
Figure 3D:
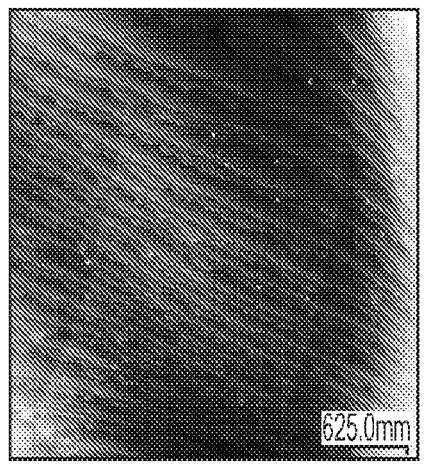
FIG. 3D is a STM image of a Si surface showing surface reconstruction of 10,000 boxes, according to examples of the present disclosure.

In experiments conducted by the inventors, a single crystalline, p-type, Si (100) wafer was used to test, both imaging and writing modes using the STM, e.g., STM 200 with the GaN tip 205. The native oxide of the Si wafer was removed using an HF solution. FIG. 3A is the STM image of the Si wafer using one of the GaN tips showing a 2×1 dimer reconstruction. The quality of the image is as good as for the standard metal tips. Consequentially, lithography was performed using the GaN in a "writing mode." FIG. 3B is a negative sample bias STM image of an H-passivated Si surface taken following the writing step showing the 2×1 dimer reconstruction. The white line 305 was written with a positive bias applied to the Si with higher current, compared to the imaging mode, flowing between the STM tip and the sample. FIG. 3C is a negative sample bias STM image of 9 boxes, each consisting of 9 lines, that were written in a similar way as was used to write the single line of FIG. 3B, testing the composite tip for durability. FIG. 3D shows the lithography results after writing 10,000 boxes on the Si surface. The results are very promising and they are similar, if not better, to results with conventional metal STM tips. TEM inspection of the tip after this extending writing showed that there was carbon contamination that had flowed to the high field region at the tip, but the GaN material was unaffected. Cleaning protocols applied before use of the tip and periodically during tip operation will extend further the writing time with a single tip.

According to some examples, the composite tips can be grown directly on Si pedestals, which simplifies the fabrication process allowing large scale fabrication. According to some examples, a linear array of independently controlled tips can be mounted to allow parallel writing capabilities. According to some examples, a material with a larger bond strength can be used to provide additional robustness, such as AlN with a bond strength of 11.5 eV/atom.

According to examples of the present disclosure, a composite tip for scanning tunneling microscopy and scanning tunneling lithography is provided, which comprises a single crystal GaN tip with dimensions of ~2 µm long and 0.5 µm faceted diameter coming to a sharp tip with a tip radius of <2 nm and a conductivity of ~$10^{-4}$ ohm-cm; and the GaN tip welded to a metal wire for use in an STM apparatus.

According to examples of the present disclosure, a method of forming a composite tip for scanning tunneling microscopy and scanning tunneling lithography is provided. The method can comprise growing an array of GaN tips by selective-area metal-organic chemical vapor deposition with dimensions of more or less a length of 2 µm, a faceted diameter of 0.5 micron, coming to a tip radius of <~2 nm, and with a controlled doping to provide a resistivity of <$10^{-2}$ Ohm-cm; selecting a single GaN nanowire from the array with a nanomanipulator, transferring the single GaN nanowire from the growth substrate to a wire prepared for scanning tunneling microscopy and milled off to provide a more or less flat surface perpendicular to the wire direction; and welding the single GaN nanowire to the milled off surface of the STM wire using an organometallic Pt source.

According to examples of the present disclosure, a method of forming multiple composite tips for scanning tunneling microscopy and scanning tunneling lithography is provided. The method can comprise preparing an array of GaN (or other semiconductor) STM tips with 3D silicon manufacturing techniques; protecting all but selective growth areas of the Si STM tips with a dielectric film; using selective area MOCVD to grow GaN nanowires from the selective areas; wherein the dimensions of the GaN nanowires are more or less 2 µm long and a faceted diameter of 0.5 µm with a tip radius of more or less 2 nm and doped to provide a resistivity of <$10^{-2}$ Ohm-cm; separating the individual silicon-GaN structures for use in scanning tunneling microscopy or scanning tunneling lithography apparatus.

Figure 4A:
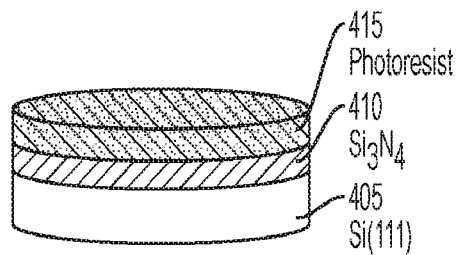
FIG. 4A is a silicon (111) wafer coated with a sacrificial $Si_3N_4$ layer and a photoresist layer used for the fabrication of large numbers of individual GaN tips, according to examples of the present disclosure.
Figure 4B:
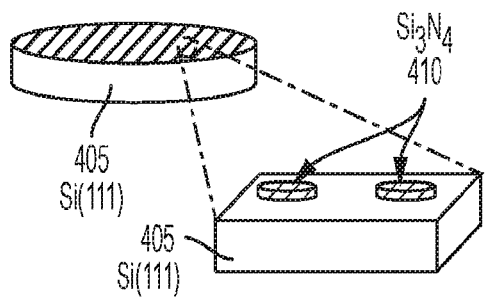
FIG. 4B shows the removal of the $Si_3N_4$ layer except in areas that will subsequently serve as nucleation sites for the GaN nanowires, according to examples of the present disclosure.
Figure 4C:
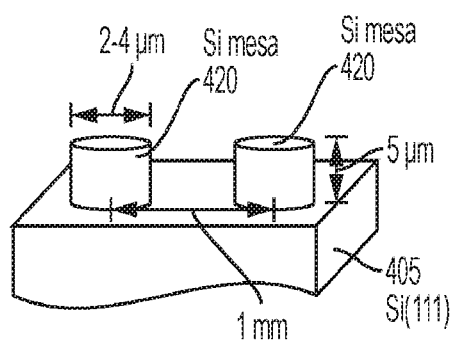
FIG. 4C shows etching of pillars to raise the GaN nanowires above the plane of the substrate, according to examples of the present disclosure.
Figure 4D:
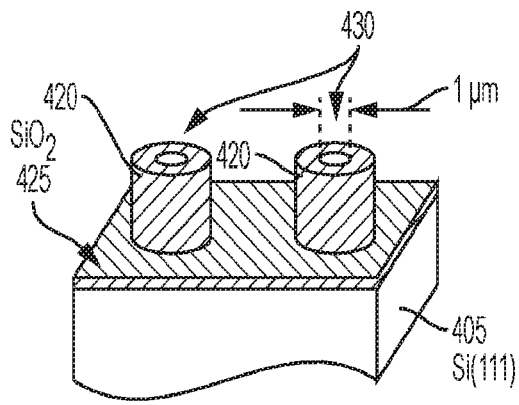
FIG. 4D shows oxidation of the Si and opening of windows exposing the Si(111) surface atop each pillar, according to examples of the present disclosure.
Figure 4E:
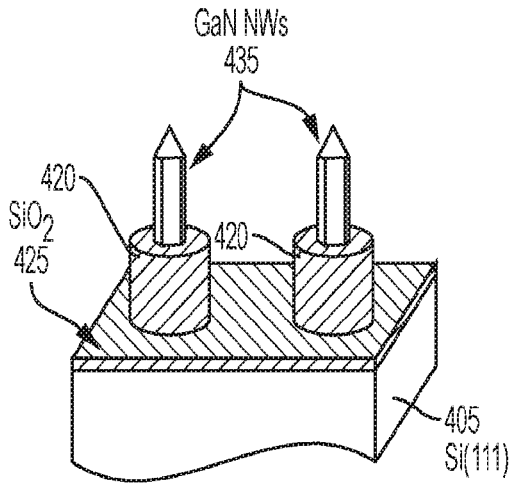
FIG. 4E shows growth of the GaN nanowires on each of the pillars, according to examples of the present disclosure.
Figure 4F:
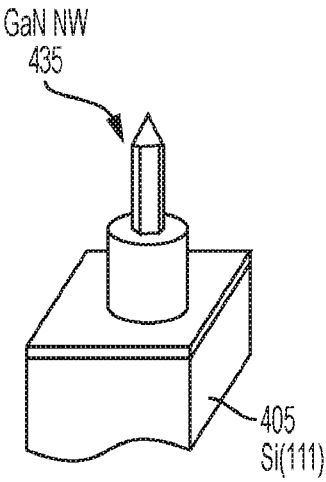
FIG. 4F shows dicing of the silicon substrate to isolate individual nanowires for mounting in STM/STL apparatus, according to examples of the present disclosure.

FIGS. 4A-4F shows an example method of producing an array of STM tips. FIG. 4A shows a Si(111) wafer 405 prepared with a sacrificial film of $Si_3N_4$ 410 and a photoresist layer 415. In FIG. 4B, the sacrificial layer 410 is removed in all areas of the wafer 405 except for those that will serve as a growth nucleating area for a GaN tip. The remaining $Si_3N_4$ areas are used as a mask to etch pedestals for the GaN tips. The formation of these pedestals is necessary to allow for small angular misalignments between the tip and the STM apparatus. As shown in FIG. 4C, the sacrificial etch mask is removed after etching of the pillars 420. In FIG. 4D, the entire wafer is oxidized 425 and small areas 430 are opened to the original Si(111) surface 405 on top of each pillar 420. The height of the pillars 420 is determined by the alignment and mounting requirements of the STM apparatus and is typically from 1 to 10 µm. The Si(111) open area 430 determines the diameter of the GaN nanowire 435 and is typically from 0.1 to 1 µm in diameter. Selective growth of the nanowires 435 is performed next using a suitable process such as MOCVD to provide the GaN nanowires 435 as illustrated in FIG. 4E. Finally the Si wafer 405 is diced to provide individual nanowires 435 as shown in FIG. 4F. In some embodiments, an array of nanowires can be provided for multiple STM tip applications.

It will be understood that there are many variants of the process illustrated in FIGS. 4A-4F involving different sacrificial layers, different nanowire materials, and different ordering of the processes that are well known to practitioners of semiconductor growth and fabrication. Each of these is included in this disclosure.

According to examples of the present disclosure, the formation of an array of independently addressed composite tips for parallel applications of scanning tunneling microscopy and scanning tunneling lithography is provided. The formation can comprise forming a 3D silicon structure with a linear array of independently addressable structures that can be individually bent out of the plane of the Si with applied fields; protecting all but selective growth areas of the Si structures with a dielectric film; using selective area MOCVD to grow GaN nanowire from the selective areas; wherein the dimensions of the GaN nanowires are more or less 2 µm long and a faceted diameter of 0.1 to 1 µm coming to a tip radius of more or less 2 nm and doped to provide a resistivity of <$10^{-2}$ Ohm-cm; providing individually addressable electrical contacts to each element of the array; and mounting the array in a scanning tunneling microscopy or scanning tunneling lithography apparatus.

According to examples, the use of the array of composite tips for scanning tunneling microscopy or scanning tunneling lithography, wherein: each composite tip is individually addressed to provide a lithographic capability; the entire array is scanned in the surface directions (x and y) of the substrate: and individual tips are moved in the z-direction essentially perpendicular to the surface to maintain a constant tunneling current and to write individual pixels.

According to examples, the composite tips can be used for scanning tunneling microscopy and scanning tunneling lithography under ultrahigh vacuum conditions.

While the embodiments have been illustrated respect to one or more implementations, alterations and/or modifications can be made to the illustrated examples without departing from the spirit and scope of the appended claims. In addition, while a particular feature of the embodiments may have been disclosed with respect to only one of several implementations, such feature may be combined with one or more other features of the other implementations as may be desired and advantageous for any given or particular function.

Furthermore, to the extent that the terms "including", "includes", "having", "has", "with", or variants thereof are used in either the detailed description and the claims, such terms are intended to be inclusive in a manner similar to the term "comprising." As used herein, the phrase "one or more of", for example, A, B, and C means any of the following: either A, B, or C alone; or combinations of two, such as A and B, B and C, and A and C; or combinations of three A, B and C.

Other embodiments will be apparent to those skilled in the art from consideration of the specification and practice of the descriptions disclosed herein. It is intended that the specification and examples be considered as exemplary only, with a true scope and spirit of the embodiments being indicated by the following claims.

What is claimed is:

1. A composite tip for a scanning tunneling microscope ("STM"), comprising:
    an electrically conductive wire comprising a substantially cylindrical body and a distal end tapered to a diameter larger than the nanowire and terminated with a flat surface that is approximately perpendicular to the wire axis; and
    a nanowire affixed to the end of the electrically conductive wire,
    wherein a first surface at a first longitudinal end of the nanowire is affixed to the termination of the electrically conductive wire, the nanowire and the electrically conductive wire having a common longitudinal axis orientation,
    wherein the nanowire comprises a body terminating at a tip on the end away from the wire and the nanowire is composed of a single crystal wide-band-gap semiconductor comprised of group III-N material, and wherein the body of the nanowire has a substantially constant diameter and is bounded by a surface wherein the diameter ranges from about 0.1 to 1.0 micrometer and the surface comprises a first set of crystal facets corresponding to natural crystal planes of the single crystal wide-band-gap semiconductor, and
    wherein the tip of the nanowire tapers to a radius of 2 nm or less, and wherein the surface of the tip comprises additional crystal facets of the wide-band-gap semiconductor.

2. The composite tip of claim 1, wherein the composite tip has dimensions of from 0.5 to 4 μm long and a resistivity of about $10^{-2}$ Ohm-cm tapering to a sharp point at the end of the tip.

3. The composite tip of claim 1, wherein the electrically conductive wire comprises platinum, iridium, tungsten, and doped silicon and/or combinations thereof.

4. The composite tip of claim 1, wherein the group III composition comprises one or more of Ga, In, or Al.

5. The composite tip of claim 4, wherein the group III-N nanowire is grown by selective area epitaxy and the growth process is controlled to produce a sharp tip.

6. The composite tip of claim 1, wherein the electrically conductive wire and the tip are affixed having a common longitudinal axis orientation within about ±1.

7. The composite tip of claim 1, wherein the electrically conductive wire is tapered to a diameter larger than the nanowire of about 1 to 5 μm.

8. The composite tip of claim 1, wherein the tip is affixed by a weld using a Pt ion source.

9. The composite tip of claim 1, wherein the group III-N nanowire comprises a single wall nanotube.

10. The composite tip of claim 1, wherein the group III-N nanowire comprises multiwall nanotubes.

11. The composite tip of claim 1, wherein the group III-N nanowire has a cross-sectional shape comprising rectangular, hexagonal, polygonal, square, oval, or circular.

12. The composite tip of claim 1, wherein the group III-N nanowire is doped with a p-type dopant.

13. The composite tip of claim 12, wherein the p-type dopant comprises Mg, Zn, Cd, Hg, or C.

14. The composite tip of claim 1, wherein the group III-N nanowire is doped with a n-type dopant.

15. The composite tip of claim 12, wherein the p-type dopant comprises Si, Ge, Sn, S, Se, or Te.

* * * * *